(12) United States Patent
Hayami

(10) Patent No.: US 9,143,165 B2
(45) Date of Patent: Sep. 22, 2015

(54) DECODING APPARATUS AND DECODING METHOD FOR DECODING LDPC-ENCODED DATA

(71) Applicant: JVC KENWOOD Corporation, Yokohama-shi (JP)

(72) Inventor: Atsushi Hayami, Yokohama (JP)

(73) Assignee: JVC KENWOOD Corporation, Yokohama-shi (JP)

(*) Notice: Subject to any disclaimer, the term of this patent is extended or adjusted under 35 U.S.C. 154(b) by 328 days.

(21) Appl. No.: 13/871,858

(22) Filed: Apr. 26, 2013

(65) Prior Publication Data

US 2013/0246882 A1 Sep. 19, 2013

Related U.S. Application Data

(63) Continuation of application No. PCT/JP2011/006038, filed on Oct. 28, 2011.

(30) Foreign Application Priority Data

Oct. 29, 2010 (JP) ................................ 2010-244691

(51) Int. Cl.
*G06F 11/00* (2006.01)
*H03M 13/00* (2006.01)
*H03M 13/07* (2006.01)
*H03M 13/11* (2006.01)

(52) U.S. Cl.
CPC .......... *H03M 13/07* (2013.01); *H03M 13/1117* (2013.01); *H03M 13/6502* (2013.01)

(58) Field of Classification Search
CPC . H03M 13/07; H03M 13/116; H03M 13/117; H03M 13/1154; H03M 13/1162; H03M 13/6502
See application file for complete search history.

(56) References Cited

FOREIGN PATENT DOCUMENTS

| CN | 1674446 A | 9/2005 |
|---|---|---|
| JP | 2005-269535 A | 9/2005 |
| JP | 2010-028408 A | 2/2010 |
| JP | 4563454 B2 | 10/2010 |
| WO | WO-2007/007801 A1 | 1/2007 |

OTHER PUBLICATIONS

Xiang et al., An area efficient and low power multirate decoder for Quasic cyclic low density parity check codes, Sep. 2010, IEEE Transactions on very large scale integration (VLSI) systems, vol. 18, No. 10, pp. 1147 to 1460.*

(Continued)

*Primary Examiner* — Shelly A Chase
(74) *Attorney, Agent, or Firm* — Venable LLP; Michael A. Sartori

(57) ABSTRACT

A min-sum processing unit executes a min-sum algorithm on input data so as to alternately execute check node processing in which an extrinsic value ratio is updated based on prior value ratios and variable node processing in which a prior value ratio is updated based on the extrinsic value ratios. Here, an initializing unit calculates the total product of the signs of the prior value ratios associated with the row to be processed. A deriving unit derives the sign for an extrinsic value ratio associated with the row to be processed, based on the sign of the prior value ratio that is unused in the updating of the extrinsic value ratio and the total product of the signs thus calculated. An updating unit updates an extrinsic value ratio associated with the row to be processed, using the sign thus derived.

6 Claims, 8 Drawing Sheets

(56) References Cited

OTHER PUBLICATIONS

Oh et al., Min-sum decoder architectures with reding world length for LDPC codes, Jan. 2010, IEEE, pp. 105 to 115.*
The First Office Action in Chinese Patent Application No. 201180052472.6, dated Feb. 4, 2015.
Uchikawa et al., "Complexity-reducing Algorithm for Serial Min-Sum Decoding," The Institute of Electronics, Information, and Communication Engineers, Technical Report IT2008-28, 2008, vol. 108, Iss. 202, pp. 49-54.
Lin et al., "An Improved Min-Sum Based Column-Layered Decoding Algorithm for LDPC Codes," Proceedings of the IEEE Workshop on Signal Processing Systems, SIPS 2009, 2009, pp. 238-242.
International Search Report issued in International Application No. PCT/JP2011/006038 dated Nov. 22, 2011.
International Preliminary Report on Patentability issued in International Application No. PCT/JP2011/006038 dated May 14, 2013.
Office Action issued in Japanese Patent Application No. 2010-244691 dated May 28, 2013.

* cited by examiner

FIG.2

$$H_{mn} = \begin{bmatrix} 1 & 1 & 1 & 1 & 0 & 0 & 0 & 0 \\ 1 & 0 & 1 & 0 & 1 & 0 & 1 & 0 \\ 0 & 1 & 0 & 1 & 0 & 1 & 0 & 1 \\ 0 & 0 & 0 & 0 & 1 & 1 & 1 & 1 \end{bmatrix}$$

DECODING APPARATUS AND DECODING METHOD FOR DECODING LDPC-ENCODED DATA

BACKGROUND OF THE INVENTION

1. Field of the Invention

The present invention relates to a decoding technique, and particularly to a decoding apparatus and a decoding method for decoding data subjected to LDPC encoding.

2. Description of the Related Art

In recent years, LDPC (Low Density Parity Check Code) has been attracting attention as an error correction code having a strong error correction capability even if a low S/N channel is employed. Thus, LDPC has been applied in many fields. With such LDPC, the data is encoded on the transmitter side using an encoding matrix generated based on a low density check matrix. Here, the "low density check matrix" represents a matrix having elements which are either 1 or 0, wherein the number of "1" elements is small. On the other hand, on the receiver side, the data decoding and parity check are performed based on the check matrix. In particular, by means of iterative decoding such as a BP (Belief Propagation) method or the like, such an arrangement provides improved decoding performance.

With such a decoding method, check node processing, which is decoding using a check matrix in the row direction, and variable node processing, which is decoding using the check matrix in the column direction, are iteratively executed. Known examples of the check node processing include sum-product decoding using a Gallager function or otherwise a hyperbolic function. With sum-product decoding, a channel value, which can be calculated based on the variance of the transmission channel noise, is used as a prior value.

Furthermore, min-sum decoding is known, which is obtained by simplifying the sum-product decoding. Min-sum decoding allows the check node processing to be executed without involving complicated functions, i.e., requires only simple functions such as a comparison operation, a sum operation, and the like to execute the check node processing. Furthermore, min-sum decoding does not require a transmission channel value. Thus, min-sum decoding is widely employed in order to provide high-speed processing in a simple manner. In order to reduce the circuit scale for min-sum decoding, a technique has been provided in which the minimum value and the second minimum value are extracted from the prior value ratios for each row of the check matrix.

The processing for deriving the minimum value of the prior value ratio for each row of the check matrix requires only a very simple circuit configuration. However, in order to derive the second minimum value, such an arrangement requires an operation in which the second minimum value is again detected after the minimum value is derived, or otherwise requires two memory units and a memory swapping operation, leading to a problem of a complicated circuit configuration. Thus, there is a demand for a technique for reducing the amount of calculation required for min-sum decoding.

SUMMARY OF THE INVENTION

The present invention has been made in view of such a situation. Accordingly, it is a general purpose of the present invention to provide a technique for reducing the amount of calculation required for min-sum decoding.

In order to solve the aforementioned problem, a decoding apparatus according to an embodiment of the present invention comprises: an input unit configured to receive data subjected to LDPC encoding as input data; and a decoding unit configured to execute a min-sum algorithm on the data input via the input unit, so as to alternately execute check node processing in which each extrinsic value ratio is updated based on prior value ratios, and variable node processing in which each prior value ratio is updated based on the extrinsic value ratios. The decoding unit comprises: an initializing unit configured to calculate a total product of signs of the prior value ratios associated with a row to be processed, before the check node processing of each row of an LDPC-coding check matrix is started; a deriving unit configured to derive a sign for an extrinsic value ratio associated with the row to be processed, based on the sign of the prior value ratio that is unused in the updating of the extrinsic value ratio and the total product of the signs calculated by the initializing unit; and an updating unit configured to update an extrinsic value ratio associated with the row to be processed, using the sign derived by the deriving unit.

With such an embodiment, before the check node processing of each row is started, the total product of the signs of the prior value ratios associated with the row to be processed is calculated. With such an arrangement, each extrinsic value ratio is derived using the total product of the signs of the prior value ratios. Thus, such an arrangement provides a reduced amount of calculation.

Also, the initializing unit may identify the minimum value of the absolute value of the prior value ratio associated with the row to be processed, and identify a column associated with the minimum value of the absolute value of the prior value ratio thus identified. Also, when the column associated with the prior value ratio that is unused in the updating of the extrinsic value ratio does not match the column identified by the initializing unit, the deriving unit may instruct the updating unit to use the minimum value of the absolute value of the prior value ratio identified by the initializing unit. With such an arrangement, the minimum value of the absolute value of the prior value ratio identified beforehand is used to update the extrinsic value ratio, thereby allowing the derivation of the minimum value of the absolute value ratio of the prior value ratio to be omitted.

Another embodiment of the present invention also relates to a decoding apparatus. The decoding apparatus comprises: an input unit configured to receive data subjected to LDPC encoding as input data; and a decoding unit configured to execute a min-sum algorithm on the data input via the input unit, so as to alternately execute check node processing in which each extrinsic value ratio is updated based on prior value ratios, and variable node processing in which each prior value ratio is updated based on the extrinsic value ratios. The decoding unit comprises: an initializing unit configured to identify the minimum value of the absolute value of the prior value ratio associated with a row to be processed, and to identify a column associated with the minimum value of the absolute value of the prior value ratio thus identified, before the check node processing of each row of an LDPC-coding check matrix is started; a deriving unit configured to derive a value that differs from the minimum value of the absolute value of the prior value ratio identified by the initializing unit, for an extrinsic value ratio associated with the row to be processed, when a column associated with the prior value ratio that is unused in the updating of the extrinsic value ratio matches the column identified by the initializing unit; and an updating unit configured to update an extrinsic value ratio associated with the row to be processed, using the value derived by the deriving unit. When a column associated with the prior value ratio that is unused in the updating of the extrinsic value ratio does not match the column identified by the initializing unit, the deriving unit instructs the updating unit to use the minimum value of the absolute value of the prior value ratio identified by the initializing unit.

With such an embodiment, the value that differs from the minimum value is derived only when the column associated with the prior value ratio that is unused in the updating of the extrinsic value ratio matches the column identified beforehand. Otherwise, the minimum value identified beforehand is used. Thus, such an arrangement provides a reduced amount of calculation.

Yet another embodiment of the present invention relates to a decoding method. The decoding method comprises: inputting data subjected to LDPC encoding; and executing a minsum algorithm on the data thus input, so as to alternately execute check node processing in which each extrinsic value ratio is updated based on prior value ratios, and variable node processing in which each prior value ratio is updated based on the extrinsic value ratios. The aforementioned executing comprises: calculating the total product of signs of the prior value ratios associated with a row to be processed, before the check node processing of each row of an LDPC-coding check matrix is started; deriving a sign for an extrinsic value ratio associated with the row to be processed, based on the sign of the prior value ratio that is unused in the updating of the extrinsic value ratio and the total product of the signs thus calculated; and updating an extrinsic value ratio associated with the row to be processed, using the sign thus derived.

Also, the decoding method may further comprise: identifying the minimum value of the absolute value of the prior value ratio associated with the row to be processed, and identifying a column associated with the minimum value of the absolute value of the prior value ratio thus identified; and providing the identified minimum value of the absolute value of the prior value ratio such that it is used in the updating, when the column associated with the prior value ratio that is unused in the updating of the extrinsic value ratio does not match the identified column.

Yet another embodiment of the present invention relates to a decoding method. The decoding method comprises: inputting data subjected to LDPC encoding; and executing a minsum algorithm on the data input thus input, so as to alternately execute check node processing in which each extrinsic value ratio is updated based on prior value ratios, and variable node processing in which each prior value ratio is updated based on the extrinsic value ratios. The aforementioned executing comprises: identifying the minimum value of the absolute value of the prior value ratio associated with a row to be processed, and identifying a column associated with the minimum value of the absolute value of the prior value ratio thus identified, before the check node processing of each row of an LDPC-coding check matrix is started; deriving a value that differs from the minimum value of the absolute value of the prior value ratio thus identified, for an extrinsic value ratio associated with the row to be processed, when a column associated with the prior value ratio that is unused in the updating of the extrinsic value ratio matches the column thus identified; and updating an extrinsic value ratio associated with the row to be processed, using the value thus derived. In the deriving, when a column associated with the prior value ratio that is unused in the updating of the extrinsic value ratio does not match the column thus identified, the minimum value of the absolute value of the prior value ratio thus identified is provided to be used in the updating.

It should be noted that any combination of the aforementioned components and any manifestation of the present invention may be transformed among a method, apparatus, system, recording medium, computer program, and so forth, which are effective as an embodiment of the present invention.

BRIEF DESCRIPTION OF THE DRAWINGS

Embodiments will now be described, by way of example only, with reference to the accompanying drawings which are meant to be exemplary, not limiting, and wherein like elements are numbered alike in several Figures, in which:

FIG. 2 is a diagram showing a check matrix used by an LDPC coding unit shown in FIG. 1;

DETAILED DESCRIPTION OF THE INVENTION

The invention will now be described by reference to the preferred embodiments. This does not intend to limit the scope of the present invention, but to exemplify the invention.

Before a specific description of the present invention, description will be made regarding the outline of the present invention. An embodiment of the present invention relates to a communication system including: a transmission apparatus executes LDPC encoding; and a reception apparatus executes iterative decoding of the data (which will be referred to as "encoded data" hereafter) encoded by the transmission apparatus, using a check matrix. In particular, the reception apparatus executes a min-sum algorithm. The min-sum algorithm includes check node processing and variable node processing. Here, the check node processing is complex in comparison with the variable node processing. Thus, there is a demand for a technique for providing simplified check node processing, which provides simplified min-sum algorithm processing. In order to meet this demand, a communication system according to the present embodiment executes the following operation.

The reception apparatus identifies the minimum value of the absolute value of the prior value ratio from among the prior value ratios that have been set for the row to be processed, and identifies the column for which the minimum value thus identified has been set. Furthermore, the reception apparatus calculates the total product of the signs of the prior value ratios. The reception apparatus updates each extrinsic value ratio using the minimum value, the information with respect to the column, and the total product of the signs. That is to say, the reception apparatus executes a common operation as a single operation before it updates the multiple extrinsic value ratios that have been set for each row, thereby providing a reduced amount of processing required for the check node processing.

Figure 1:
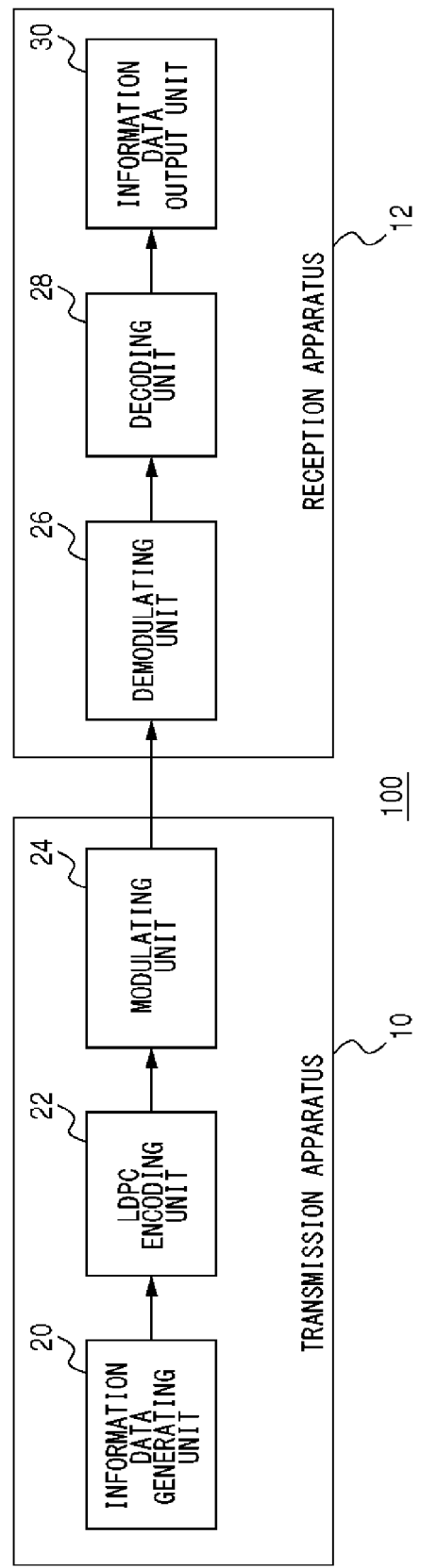
FIG. 1 is a diagram showing a configuration of a communication system according to an embodiment of the present invention.

FIG. 1 shows a configuration of a communication system according to an embodiment of the present invention. A communication system 100 includes a transmission apparatus 10 and a reception apparatus 12. The transmission apparatus 10 includes an information data generating unit 20, an LDPC encoding unit 22, and a modulating unit 24. The reception apparatus 12 includes a demodulating unit 26, a decoding unit 28, and an information data output unit 30.

The information data generating unit 20 acquires the data to be transmitted, and generates information data. It should be noted that the data thus acquired may be used as the information data as it is. The information data generating unit 20 outputs the information data to the LDPC encoding unit 22. The LDPC encoding unit 22 receives the information data from the information data generating unit 20 as the input data. The LDPC encoding unit 22 appends parity data (which will be referred to as "LDPC parity data" hereafter) generated using the LDPC check matrix to the information data. The information data to which the parity data has been appended corresponds to the aforementioned encoded data. The LDPC encoding unit 22 outputs the encoded data to the modulating unit 24. FIG. 2 shows a check matrix used by the LDPC encoding unit 22. The check matrix Hmn is configured as a matrix of m rows and n columns. Here, for clarity of description, description will be made assuming that the check matrix Hmn is configured as a matrix of 4 rows and 8 columns. However, the present invention is not restricted to such an arrangement. Returning to FIG. 1, description will be made.

The modulating unit 24 receives, as the input data, the encoded data from the LDPC encoding unit 22. The modulating unit 24 modulates the encoded data. Examples of modulation schemes which can be used include PSK (Phase Shift Keying), FSK (Frequency Shift Keying), and the like. The modulating unit 24 transmits the encoded data thus modulated as a modulated signal. The demodulating unit 26 receives the modulated signal from the modulating unit 24 via a transmission channel, e.g., via a wireless transmission channel, and demodulates the modulated signal. Known techniques can be applied to the demodulation, and description thereof will be omitted. The demodulating unit 26 outputs the demodulated result (which will be referred to as the "demodulated data" hereafter) to the decoding unit 28.

The decoding unit 28 receives the demodulated data from the demodulating unit 26 as an input signal, and executes iterative decoding processing on the demodulated data using the LDCP check matrix. As the decoding processing, the min-sum algorithm is executed, for example. The min-sum algorithm is executed according to the following procedure.

1. Initialization: The prior value ratios are initialized, and the maximum number of decoding iterations is set.
2. Check node processing: The extrinsic value ratios are updated in the row direction of the check matrix.
3. Variable node processing: The prior value ratios are updated in the column direction of the check matrix.
4. A temporary estimated word is calculated.

The decoding unit 28 outputs the decoded result (which will be referred to as the "decoded data" hereafter) to the information data output unit 30. The information data output unit 30 receives the decoded data from the decoding unit 28 as the input data, and generates the information data based on the decoded data thus received. It should be noted that the decoded data may be used as the information data as it is. The information data output unit 30 may include an outer-code decoding unit, and may decode an outer code such as CRC or the like.

Such a configuration may be realized by means of hardware devices such a CPU, memory, and other LSIs, included in a given computer, or may be realized by means of software components such as a program or the like loaded into memory. Here, a functional block realized by combining such components are shown. Thus, such functional blocks can be realized by hardware components alone, software components alone, or various combinations thereof, which can be readily conceived by those skilled in this art.

Figure 3:
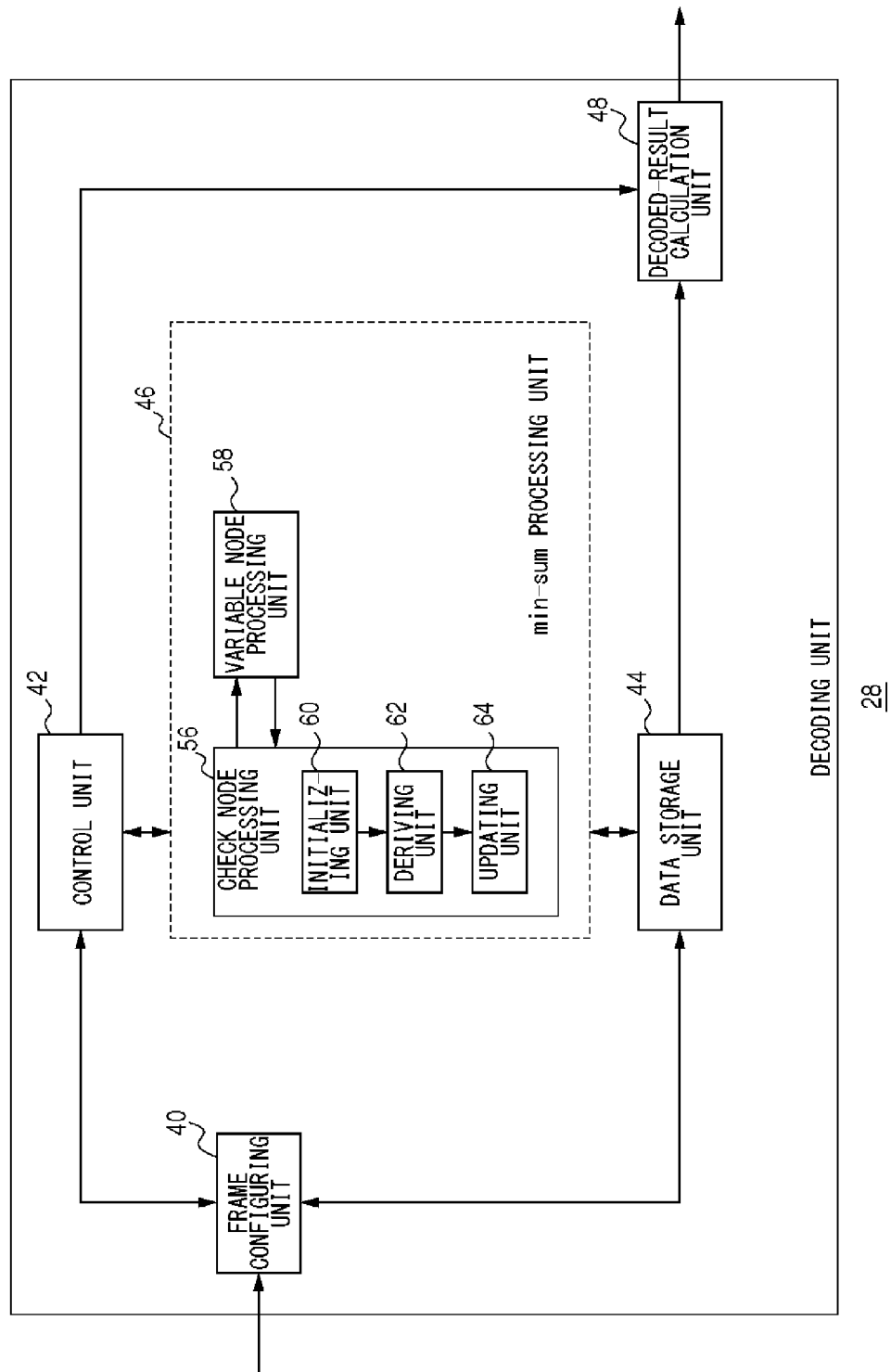
FIG. 3 is a diagram showing a configuration of a decoding unit shown in FIG. 1.

FIG. 3 shows a configuration of the decoding unit 28. The decoding unit 28 includes a frame configuring unit 40, a control unit 42, a data storage unit 44, a min-sum processing unit 46, and a decoded-result calculation unit 48. Furthermore, the min-sum processing unit 46 includes a check node processing unit 56 and a variable node processing unit 58. The check node processing unit 56 includes an initializing unit 60, a deriving unit 62, and an updating unit 64.

The frame configuring unit 40 receives the demodulated data from the unshown demodulating unit 26 as input data. The demodulated data can be said to be LDPC-encoded data that has passed through the transmission channel. The frame configuring unit 40 detects a frame synchronization signal included in the demodulated data, and identifies the unit of the frame to be configured by the demodulated data, based on the frame synchronization signal. For example, in a case in which the frame synchronization signal is arranged at the frame header, and the frame period is configured with a fixed length, the frame configuring unit 40 sets the frame to a fixed-length period after the frame synchronization signal is detected. It should be noted that the unit of the LDPC encoding may be set to a frame. The frame configuring unit 40 instructs the data storage unit 44 to store the demodulated data in units of frames. The data storage unit temporarily stores the demodulated signal in units of frames.

Figure 4:
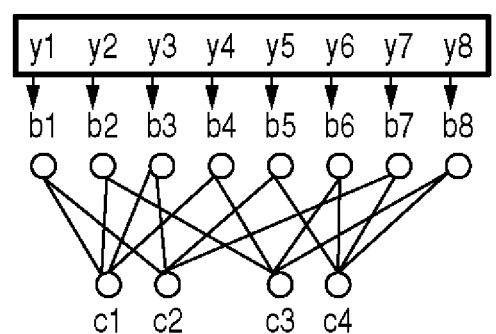
FIG. 4 is a Tanner graph showing a schematic configuration of the operation of the decoding unit shown in FIG. 3.

The min-sum processing unit 46 receives the demodulated data from the data storage unit 44, and executes the min-sum algorithm on the demodulated data. With the min-sum algorithm, the operation of the check node processing unit 56 and the operation of the variable node processing unit 58 are alternately executed. FIG. 4 shows a Tanner graph showing a schematic configuration of the operation of the decoding unit 28. In the Tanner graph, b1 through b8 each represent a variable node, and c1 through c4 each represent a check node. With the index number of the variable node as n, bn represents the n-th variable node. Furthermore, with the index number of the check node as m, cm represents the m-th check node. The variable nodes b1 through b8 are respectively connected to data y1 through y8 stored in the data storage unit 44 shown in FIG. 3.

The check node processing unit 56 initializes the prior value ratios β in the first step of the iterative decoding operation. In this case, the demodulated data stored in the data storage unit 44 is used as the prior value ratios β as it is. Next, the check node processing unit 56 calculates the minimum value of the absolute value of the prior value ratio, i.e., min |βmn'|. The check node processing unit 56 updates the extrinsic value ratio for each connection between the respective check nodes and variable nodes, i.e., updates αmn for each connection between cm and bn. The extrinsic value ratio αmn is calculated according to the following Expression for each of all the combinations (m, n) that satisfy the condition: check matrix element Hmn=1.

$$\alpha mn = a(\Pi sign(\beta mn')) \cdot \min |\beta mn'| \qquad (1)$$

Figure 5:
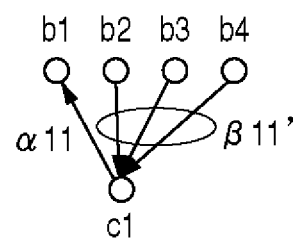
FIG. 5 is a diagram showing a schematic configuration of an extrinsic value ratio updating operation of the decoding unit shown in FIG. 3.

Here, n' represents $A(m) \mathbb{Y} n$. A(m) represents a set of the variable nodes connected to the check node m, and the symbol ¥n represents a difference set which does not include n. Furthermore, the symbol sign represents a signature function, and min |βmn'| represents a selection of the minimum value of the absolute value. Here, a represents a normalization constant. FIG. 5 shows the schematic configuration of the extrinsic value ratio updating operation performed by the decoding unit 28. The extrinsic value ratio $\alpha 11$ is derived from $\beta 11'$. That is to say, the check node processing unit 56 updates each extrinsic value ratio based upon the prior value ratios. Returning to FIG. 3, the minimum value of the absolute value of the prior value ratio min $|\beta mn'|$ is derived for each iterative decoding step.

Based upon the prior value ratios $\alpha mn$, the variable node processing unit 58 updates the prior value ratio for each connection between the respective check nodes and variable nodes, i.e., updates $\beta mn$ for each connection between bm and cn. The prior value ratio $\beta mn$ is calculated according to the following Expression for each of all the combinations (m, n) that satisfy the condition: check matrix element Hmn=1.

$$\beta mn = \Sigma \alpha m'n + \lambda n \qquad (2)$$

Figure 6:
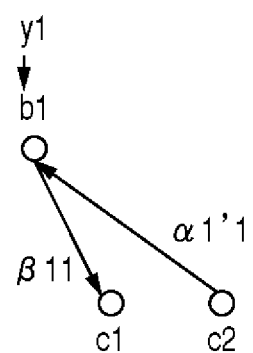
FIG. 6 is a diagram showing a schematic configuration of a prior value ratio updating operation of the decoding unit shown in FIG. 3.

Here, $\lambda n$ is equal to the input data yn. The input data yn corresponds to the demodulated data received from the demodulating unit 26. Furthermore, m' represents a set of check nodes that are connected to the variable node n. The symbol ¥m represents a difference set which does not include m. FIG. 6 shows the schematic configuration of the prior value ratio updating operation performed by the decoding unit 28. The prior value ratio $\beta 11$ is derived from $\alpha 1'1$. That is to say, the variable node processing unit 58 updates each prior value ratio based upon the extrinsic value ratios. Returning to FIG. 3, description will be made.

After the operation of the check node processing unit 56 and the operation of the variable node processing unit 58 are executed iteratively a predetermined number of times, the decoded result calculating unit 48 calculates the temporary estimated word. It should be noted that, when the result of the parity check is correct, the decoded result calculation unit 48 may calculate the temporary estimated word, even before the aforementioned operations are performed iteratively the predetermined number of times. The control unit 42 controls the operating timing of the min-sum processing unit 46.

With the operation of the check node processing unit 56 represented by Expression (1), calculation is repeatedly performed according to the number of the 1 elements of each row of the check matrix. On the other hand, with the operation of the variable node processing unit 58 represented by Expression (2), calculation is repeatedly performed according to the number of the 1 elements of each column of the check matrix. That is to say, in the check node processing, as represented by Expression (1), each extrinsic value ratio $\alpha mn$ is updated for the m-th row when the n-th element (having a column index of n) of the check matrix is equal to 1. On the other hand, in the variable node processing, each prior value ratio $\beta mn$ is updated as represented by Expression (2). With such check node processing, simplification of calculation means that the operation represented by Expression (1) is executed in a simple manner. In order to raise the processing speed for the LDPC decoding, such an arrangement requires simplification of Expression (1). Description will be made below regarding the simplification of Expression (1).

The initializing unit 60 executes initialization in the check node processing. The initialization performed by the initializing unit 60 comprises two kinds of initialization. That is to say, one kind is (1) initialization before the iterative decoding, and the other kind is (2) initialization for the row processing. As the initialization (1), i.e., the initialization before the iterative decoding, as described above, the initializing unit sets the data y1 through y8 stored in the data storage unit 44 shown in FIG. 3 for the respective prior value ratios $\beta mn$.

The initialization (2), i.e., the initialization for the row processing, corresponds to initialization processing before the start of the check node processing for each row of the LDPC-coding check matrix. The initializing unit 60 identifies the minimum value of the absolute value of the prior value ratio $\beta tmp$ for the row to be processed. Furthermore, the initializing unit 60 identifies the column Nmin associated with the minimum value of the absolute value of the prior value ratio $\beta tmp$ thus identified. Here, the column corresponds to the aforementioned column index. The initializing unit 60 instructs the data storage unit 44 shown in FIG. 3 to store the minimum value of the absolute value of the prior value ratio $\beta tmp$ and the column index Nmin. Furthermore, the initializing unit 60 calculates the total product of the signs of the prior value ratios $\beta mn$ associated with the row to be processed. The initializing unit 60 instructs the data storage unit 44 to store the total product of the signs SIGNtmp.

Specific description will be made below regarding a step in which the initialization is executed for the first row. In this step, as shown in FIG. 4, the check node to be processed is C1. Description will be made below assuming that $\beta 11 = -3$, $\beta 12 = 4$, $\beta 13 = -2$, and $\beta 14 = -5$. In this case, the initializing unit 60 identifies "2" as the minimum value of the absolute value of the prior value ratio $\beta tmp$, and identifies "3" as the column index Nmin that corresponds to the minimum value of the absolute value of the prior value ratio thus identified. Furthermore, the initializing unit 60 calculates the total product of the signs SIGNtmp, thereby obtaining "minus (–)" as the calculation result. It should be noted that description has been made regarding an arrangement in which the total product of the signs SIGNtmp is obtained by calculating the total product of the signs of all the prior value ratios. Instead of such an arrangement, the total product of the signs may be obtained by means of other calculations such as exclusive OR or the like.

The deriving unit 62 calculates ($\Pi$ sign($\beta mn'$)) and min $|\beta mn'|$ terms of Expression (1) for each extrinsic value associated with the row to be processed. Furthermore, the deriving unit 62 sequentially selects an extrinsic value ratio to be updated for each row. The deriving unit 62 judges whether or not the column associated with the prior value ratio $\beta mn$ that is unused in the updating of the extrinsic value ratio $\alpha mn$ matches the column index Nmin identified by the initializing unit 60, for each extrinsic value ratio $\alpha mn$ associated with the row to be processed. Here, the prior value ratio $\beta mn$ that is unused in the updating of the extrinsic value ratio $\alpha mn$ represents a prior value ratio having a column index "n" that is the same as that of the extrinsic value ratio $\alpha mn$. For example, when the extrinsic value ratio "$\alpha 11$" is selected for the row to be processed, the prior value ratio that is unused in the updating is "$\beta 11$". Similarly, when "$\alpha 12$" is selected, "$\beta 12$" is identified. When "$\alpha 13$" is selected, "$\beta 13$" is identified. When "$\alpha 14$" is selected, "$\beta 14$" is identified.

When the column associated with the prior value ratio $\beta mn$ that is unused in the updating of the extrinsic value ratio $\alpha mn$ matches the column index Nmin identified by the initializing unit 60, the driving unit 62 selects a value (which will also be referred to as the "minimum value of the absolute value of the prior value ratio $\beta tmp$" for ease of description) which is different from the minimum value of the absolute value of the prior value ratio $\beta tmp$ identified by the initializing unit 60. In the aforementioned example, when "$\alpha 13$" is selected, "3" is derived as $\beta tmp$. On the other hand, when the column associated with the prior value ratio $\beta mn$ that is unused in the updating of the extrinsic value ratio $\alpha mn$ does not match the column index Nmin identified by the initializing unit 60, the driving unit 62 sets the minimum value of the absolute value of the prior value ratio identified by the initializing unit 60 as βtmp. In the aforementioned example, when "α11", "α12", or "α14" is selected, "2" is set as βtmp.

Furthermore, the deriving unit 62 derives the sign based on the sign of the prior value ratio βmn that is unused in the updating of the extrinsic value ratio αmn and the total product of the signs SIGNtmp calculated by the initializing unit 60. In the aforementioned example, the signs of the prior value ratios βmn that are unused in the updating are "minus (−)", "plus (+)", "minus (−)", and "minus (−)" for the extrinsic value ratios "α11", "α12", "α13", and "α14", respectively. Furthermore, the total product of the signs SIGNtmp is "minus (−)". Thus, the signs thus derived are "plus (+)", "minus (−)", "plus (+)" and "plus (+)" for the extrinsic value ratios "α11", "α12", "α13", and "α14", respectively. The deriving unit 62 outputs the minimum value of the absolute value of the prior value ratio βtmp and the sign thus derived to the updating unit 64.

The updating unit 64 updates each extrinsic value ratio αmn for the row to be processed, using the minimum value of the absolute value of the prior value ratio βtmp and the sign derived by the deriving unit 62. Furthermore, the deriving unit 62 sequentially updates the extrinsic value ratios αmn for each row. In the aforementioned example, the operation described above will be summarized as follows. When "α11" is to be updated, the column index is "1", and, accordingly, the column index is different from Nmin=3. Thus, as the updated extrinsic value ratio α11, "+2" is derived from the "plus (+)" obtained by multiplying "minus (−)", which is the total product of the signs "SIGNtmp", by the sign (−) of "β11", and "βtmp=2". When "α12" is to be updated, the column index is "2", and accordingly, the column index is different from Nmin=3. Thus, as the updated extrinsic value ratio α12, "−2" is derived from the "minus (−)" obtained by multiplying "minus (−)", which is the total product of the signs "SIGNtmp", by the sign (+) of "β12", and "βtmp=2".

When "α13" is to be updated, the column index is "3", and, accordingly, the column index is the same as Nmin=3. Thus, as the updated extrinsic value ratio α13, "3" is derived from the "plus (+)" obtained by multiplying "minus (−)", which is the total product of the signs "SIGNtmp", by the sign (−) of "β12", and "3" calculated using the conventional Expression (1). When "α14" is to be updated, the column index is "4", and, accordingly, the column index is different from Nmin=3. Thus, as the updated extrinsic value ratio α14, "+2" is derived from the "plus (+)" obtained by multiplying "minus (−)", which is the total product of the signs "SIGNtmp", by the sign (−) of "β14", and "βtmp=2". As a result, as the updated extrinsic value ratios α11, α12, α13, and α14 are respectively derived as "+2", "−2", "+3", and "+2".

It should be noted that each extrinsic value ratio a thus derived may be multiplied by a constant (normalization constant) that is smaller than 1, so as to provide normalized min-sum decoding. After the check node processing is performed on the first row as described above, the check node processing may be performed on the second row. Also, as the next step, the variable node processing may be performed using the extrinsic value ratios α thus updated in the check node processing for the first row.

Figure 7:
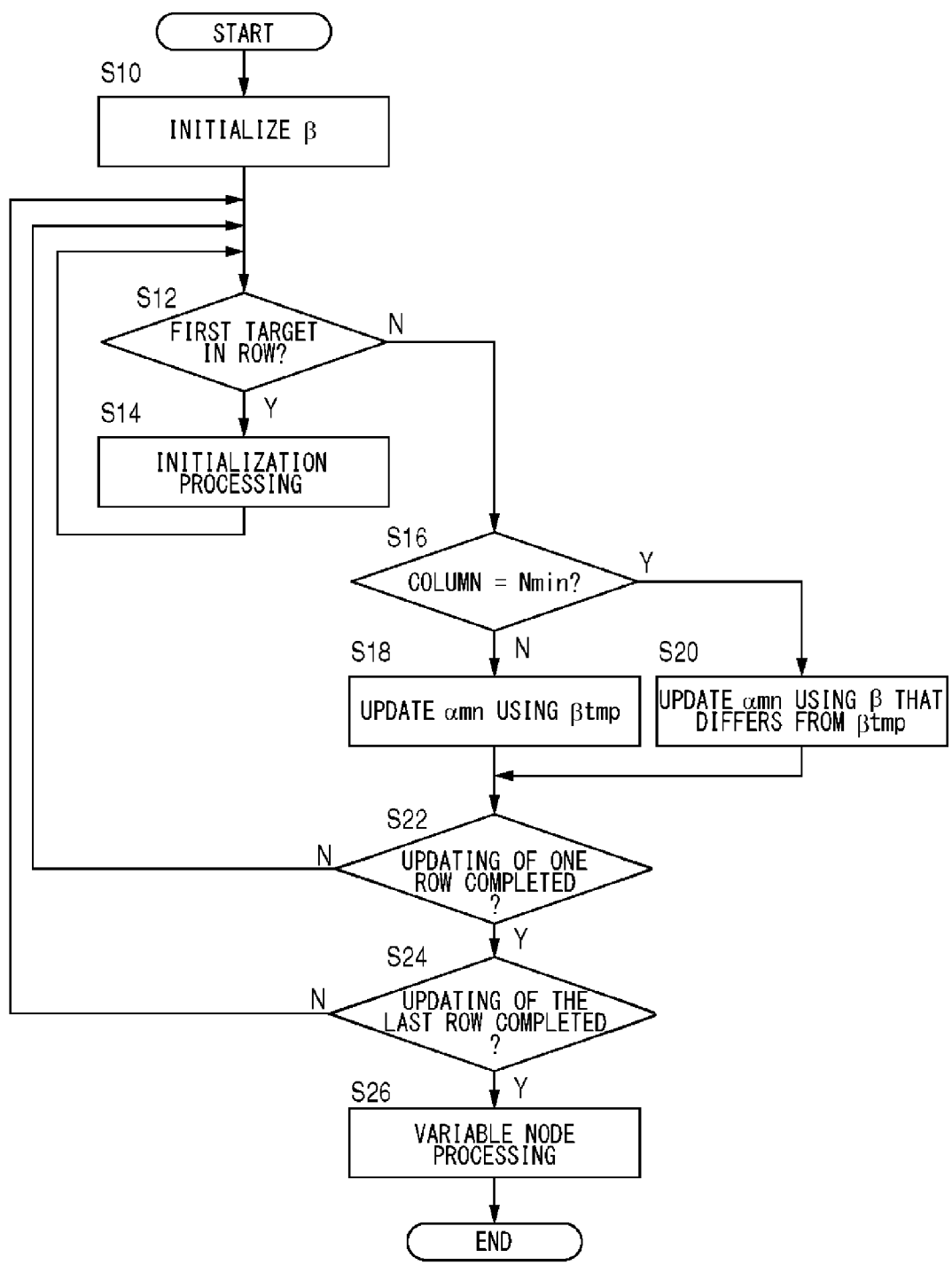
FIG. 7 is a flowchart showing a decoding procedure executed by the decoding unit shown in FIG. 3.

Description will be made regarding the operation of the communication system 100 having the aforementioned configuration. FIG. 7 is a flowchart showing a decoding procedure executed by the decoding unit 28. The initializing unit 60 initializes the prior value ratios β (S10). When the processing is to be performed on the first target in a row to be processed ("Y" in S12), the initializing unit 60 executes the initialization processing (S14), and the flow returns to Step 12. When the processing is to be performed on a target in a row other than the first target ("N" in S12), and when the column index does not match Nmin ("N" in S16), the deriving unit 62 and the updating unit 64 update the extrinsic value ratio αmn using βtmp (S18). When the row matches Nmin ("Y" in S16), the deriving unit 62 and the updating unit 64 update the extrinsic value ratio αmn using a β that differs from βtmp (S20). When the updating processing of one row has not been completed ("N" in S22), the flow returns to Step 12. When the updating processing of one row has been completed ("Y" in S22), and when the processing of the last row has not been completed ("N" in S24), the flow returns to Step 12. When the updating processing of the last row has been completed ("Y" in S24), the variable node processing unit 58 executes the variable node processing (S26).

Figure 8:
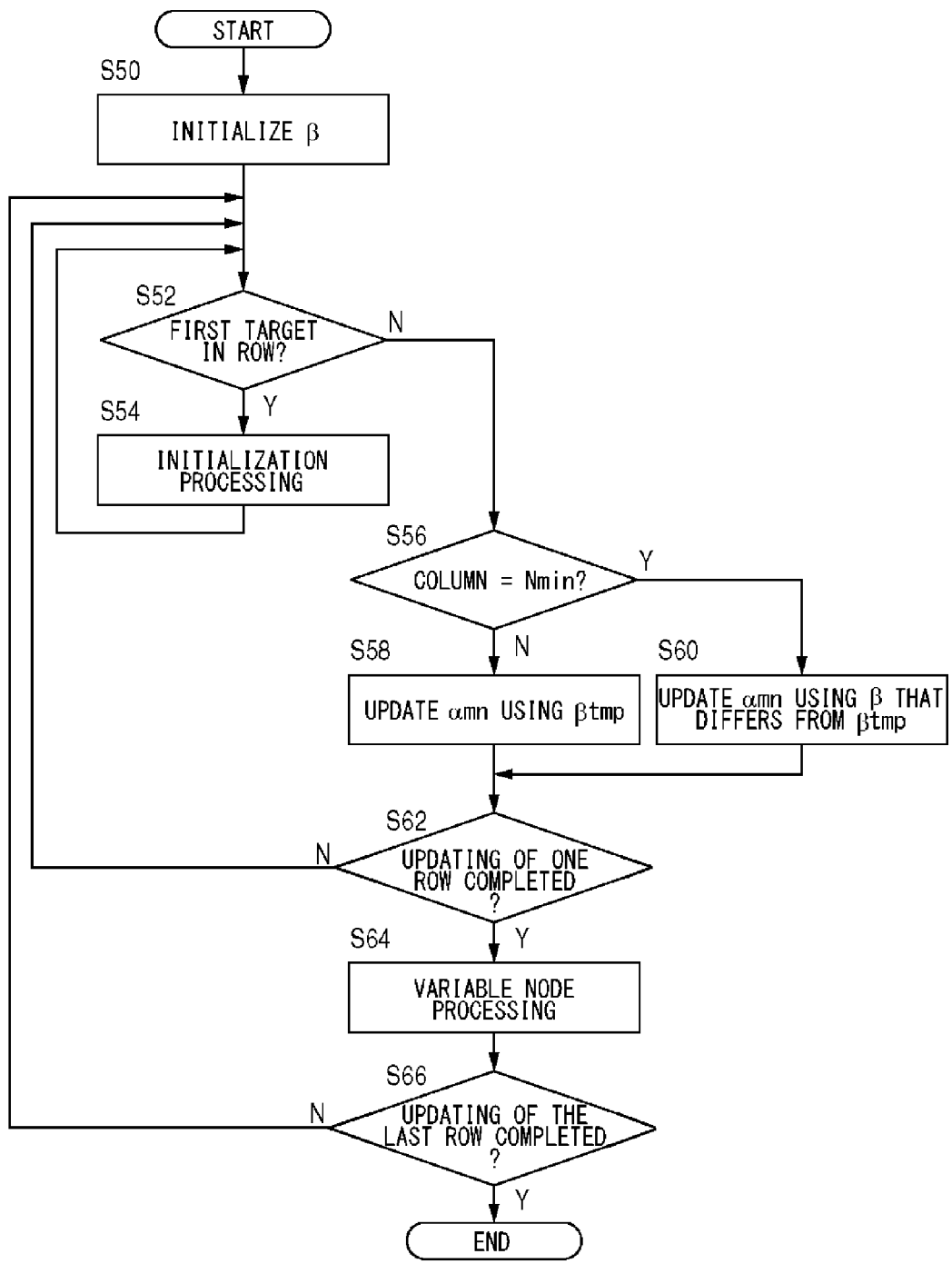
FIG. 8 is a flowchart showing another decoding procedure executed by the decoding unit shown in FIG. 3.

FIG. 8 is a flowchart showing another decoding procedure executed by the decoding unit 28. This procedure corresponds to an arrangement in which the variable node processing is executed for each performance of the row processing. The initializing unit 60 initializes the prior value ratios β (S50). When the processing is to be performed on the first target in a row to be processed ("Y" in S52), the initializing unit 60 executes the initialization processing (S54), and the flow returns to Step 52. When the processing is to be performed on a target in the row other than the first target ("N" in S52), and when the column index does not match Nmin ("N" in S56), the deriving unit 62 and the updating unit 64 update the extrinsic value ratio αmn using βtmp (S58). When the row matches Nmin ("Y" in S56), the deriving unit 62 and the updating unit 64 update the extrinsic value ratio αmn using β that differs from βtmp (S60). When the updating processing of one row has not been completed ("N" in S62), the flow returns to Step 52. When the updating processing of one row has been completed ("Y" in S62), the variable node processing unit 58 executes the variable node processing (S64). When the processing of the last row has not been completed ("N" in S66), the flow returns to Step 52. When the updating processing of the last row has been completed ("Y" in S66), the processing ends.

With the embodiment of the present invention, before the start of the check node processing for each row, the total product of the signs of the prior value ratios associated with the row to be processed is calculated, and the total product of the signs thus calculated is used to derive each of the extrinsic value ratios. Thus, such an arrangement allows the calculation of the total product of the signs to be omitted for each derivation of each extrinsic value ratio. That is to say, the calculation of the total product of the signs is omitted when each extrinsic value ratio is derived, thereby providing a reduced amount of calculation. Furthermore, the minimum value of the absolute value of the prior value ratio is identified beforehand, and each extrinsic value ratio is updated using the minimum value of the absolute value of the prior value ratio thus identified. Thus, such an arrangement allows the derivation of the minimum value of the absolute value of the prior value ratio to be omitted.

That is to say, the derivation of the minimum value of the absolute value of the prior value ratio is omitted for each updating of each extrinsic value ratio, thereby providing a reduced amount of calculation. Furthermore, with such an arrangement, a value that differs from the minimum value is derived only when the column associated with a prior value ratio that is unused for updating the extrinsic value ratio matches a column index identified beforehand. Otherwise, the extrinsic value ratio is updated using the minimum value identified beforehand. Thus, such an arrangement provides a reduced amount of calculation. By providing a reduced amount of calculation, such an arrangement provides a simplified min-sum algorithm. Furthermore, when the column index does not match Nmin, calculation can be omitted in the check node processing. Such an arrangement is capable of reducing the number of times addition and multiplication are performed, to a level on the order of ¼ of that required for a conventional arrangement in which the calculation for the check node processing is executed without such simplification.

Description has been made regarding the present invention with reference to the embodiments. The above-described embodiments have been described for exemplary purposes only, and are by no means intended to be interpreted restrictively. Rather, it can be readily conceived by those skilled in this art that various modifications may be made by making various combinations of the aforementioned components or processes, which are also encompassed in the technical scope of the present invention.

Description has been made regarding the embodiments of the present invention assuming that the communication system 100 is configured as a wireless communication system. Thus, the transmission apparatus 10 and the reception apparatus 12 are included in the wireless communication apparatus. However, the present invention is not restricted to such an arrangement. Also, an embodiment may be configured assuming that the communication system 100 is configured as a wired communication system. With such an arrangement, the transmission apparatus 10 and the reception apparatus 12 are included in the wired communication apparatus. With the present modification, the present invention can be applied to various kinds of apparatuses.

What is claimed is:

1. A decoding apparatus comprising:
an input unit configured to receive data subjected to LDPC encoding as input data; and
a decoding unit configured to execute a min-sum algorithm on the data input via the input unit, so as to alternately execute check node processing in which each extrinsic value ratio is updated based on prior value ratios, and variable node processing in which each prior value ratio is updated based on the extrinsic value ratios,
wherein the decoding unit comprises:
an initializing unit configured to calculate a total product of signs of the prior value ratios associated with a row to be processed, before the check node processing of each row of an LDPC-coding check matrix is started;
a deriving unit configured to derive a sign for an extrinsic value ratio associated with the row to be processed, based on the sign of the prior value ratio that is unused in the updating of the extrinsic value ratio and the total product of the signs calculated by the initializing unit; and
an updating unit configured to update an extrinsic value ratio associated with the row to be processed, using the sign derived by the deriving unit.

2. A decoding apparatus according to claim 1, wherein the initializing unit identifies the minimum value of the absolute value of the prior value ratio associated with the row to be processed, and identifies a column associated with the minimum value of the absolute value of the prior value ratio thus identified,
and wherein the deriving unit instructs the updating unit to use the minimum value of the absolute value of the prior value ratio identified by the initializing unit when the column associated with the prior value ratio that is unused in the updating of the extrinsic value ratio does not match the column identified by the initializing unit.

3. A decoding apparatus comprising:
an input unit configured to receive data subjected to LDPC encoding as input data; and
a decoding unit configured to execute a min-sum algorithm on the data input via the input unit, so as to alternately execute check node processing in which each extrinsic value ratio is updated based on prior value ratios, and variable node processing in which each prior value ratio is updated based on the extrinsic value ratios,
wherein the decoding unit comprises:
an initializing unit configured to identify the minimum value of the absolute value of the prior value ratio associated with a row to be processed, and to identify a column associated with the minimum value of the absolute value of the prior value ratio thus identified, before the check node processing of each row of an LDPC-coding check matrix is started;
a deriving unit configured to derive a value that differs from the minimum value of the absolute value of the prior value ratio identified by the initializing unit, for an extrinsic value ratio associated with the row to be processed, when a column associated with the prior value ratio that is unused in the updating of the extrinsic value ratio matches the column identified by the initializing unit; and
an updating unit configured to update an extrinsic value ratio associated with the row to be processed, using the value derived by the deriving unit,
and wherein, when a column associated with the prior value ratio that is unused in the updating of the extrinsic value ratio does not match the column identified by the initializing unit, the deriving unit instructs the updating unit to use the minimum value of the absolute value of the prior value ratio identified by the initializing unit.

4. A decoding method comprising:
inputting data subjected to LDPC encoding; and
executing a min-sum algorithm on the data thus input, so as to alternately execute check node processing in which each extrinsic value ratio is updated based on prior value ratios, and variable node processing in which each prior value ratio is updated based on the extrinsic value ratios,
wherein the aforementioned executing comprises:
calculating the total product of signs of the prior value ratios associated with a row to be processed, before the check node processing of each row of an LDPC-coding check matrix is started;
deriving a sign for an extrinsic value ratio associated with the row to be processed, based on the sign of the prior value ratio that is unused in the updating of the extrinsic value ratio and the total product of the signs thus calculated; and
updating an extrinsic value ratio associated with the row to be processed, using the sign thus derived.

5. A decoding method according to claim 4, further comprising:
identifying the minimum value of the absolute value of the prior value ratio associated with the row to be processed, and identifying a column associated with the minimum value of the absolute value of the prior value ratio thus identified; and
providing the identified minimum value of the absolute value of the prior value ratio such that it is used in the updating, when the column associated with the prior value ratio that is unused in the updating of the extrinsic value ratio does not match the identified column.

6. A decoding method comprising:
inputting data subjected to LDPC encoding; and executing a min-sum algorithm on the data input thus input, so as to alternately execute check node processing in which each extrinsic value ratio is updated based on prior value ratios, and variable node processing in which each prior value ratio is updated based on the extrinsic value ratios, wherein the aforementioned executing comprises:

identifying the minimum value of the absolute value of the prior value ratio associated with a row to be processed, and identifying a column associated with the minimum value of the absolute value of the prior value ratio thus identified, before the check node processing of each row of an LDPC-coding check matrix is started;

deriving a value that differs from the minimum value of the absolute value of the prior value ratio thus identified, for an extrinsic value ratio associated with the row to be processed, when a column associated with the prior value ratio that is unused in the updating of the extrinsic value ratio matches the column thus identified; and updating an extrinsic value ratio associated with the row to be processed, using the value thus derived, and wherein, in the deriving, when a column associated with the prior value ratio that is unused in the updating of the extrinsic value ratio does not match the column thus identified, the minimum value of the absolute value of the prior value ratio thus identified is provided to be used in the updating.

* * * * *